(12) United States Patent
Clark

(10) Patent No.: US 8,475,590 B2
(45) Date of Patent: *Jul. 2, 2013

(54) METHOD AND APPARATUS FOR THE PRODUCTION OF CRYSTALLINE SILICON SUBSTRATES

(75) Inventor: Roger F. Clark, Knoxville, MD (US)

(73) Assignee: AMG Idealcast Solar Corporation, Wayne, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/478,302

(22) Filed: May 23, 2012

(65) Prior Publication Data

US 2012/0260849 A1    Oct. 18, 2012

Related U.S. Application Data

(60) Continuation of application No. 12/576,614, filed on Oct. 9, 2009, now Pat. No. 8,262,795, which is a division of application No. 11/861,375, filed on Sep. 26, 2007, now Pat. No. 7,608,146.

(60) Provisional application No. 60/827,246, filed on Sep. 28, 2006.

(51) Int. Cl.
*C30B 15/04* (2006.01)

(52) U.S. Cl.
USPC .................. 117/21; 117/22; 117/30; 117/32; 117/217

(58) Field of Classification Search
USPC .................. 117/21, 22, 30, 32, 217
See application file for complete search history.

(56) References Cited

U.S. PATENT DOCUMENTS

| 2,927,008 A | 3/1960 | Shockley |
| 3,469,369 A | 9/1969 | Helmke |
| 4,289,571 A | 9/1981 | Jewett |
| 4,329,195 A | 5/1982 | Kudo |
| 4,447,289 A | 5/1984 | Geissler et al. |

(Continued)

FOREIGN PATENT DOCUMENTS

EP    1 076 117 A2    2/2001

OTHER PUBLICATIONS

Zoutenkyk, J.A., Theoretical Analysis of Heart Flow in Horizontal Ribbon Growth from a Melt, J.Appl.Phy. 49(7); Jul. 1978; pp. 3927-3932.

(Continued)

*Primary Examiner* — Bob M Kunemund
(74) *Attorney, Agent, or Firm* — Barnes & Thornburg LLP; Thomas J. McWilliams; Edward F. Behm, Jr.

(57) ABSTRACT

An apparatus and method for producing a crystalline ribbon continuously from a melt pool of liquid feed material, e.g. silicon. The silicon is melted and flowed into a growth tray to provide a melt pool of liquid silicon. Heat is passively extracted by allowing heat to flow from the melt pool up through a chimney. Heat is simultaneously applied to the growth tray to keep the silicon in its liquid phase while heat loss is occurring through the chimney. A template is placed in contact with the melt pool as heat is lost through the chimney so that the silicon starts to "freeze" (i.e. solidify) and adheres to the template. The template is then pulled from the melt pool thereby producing a continuous ribbon of crystalline silicon.

16 Claims, 3 Drawing Sheets

U.S. PATENT DOCUMENTS

| | | | |
|---|---|---|---|
| 4,563,976 A | 1/1986 | Foell et al. | |
| 4,627,887 A | 12/1986 | Sachs | |
| 4,650,541 A | 3/1987 | Ciszek | |
| 4,664,745 A | 5/1987 | Falckenberg et al. | |
| 5,069,742 A | 12/1991 | Bleil | |
| 6,111,191 A | 8/2000 | Hall et al. | |
| 6,800,137 B2 | 10/2004 | Pandelisev | |
| 7,608,146 B2 * | 10/2009 | Clark | 117/26 |

OTHER PUBLICATIONS

Bleil, C.E., *Float Zone Sheet Growth*, U.S. Dept. of Energy Grant #DE-FG45-96R551901.

Kudo, B., Improvements in the Horizontal Ribbon Growth Technique for Single Crystal Silicon, J. Cryst. Gr. 50 (1980), pp. 247-259.

International Search Report for PCT/US2007/079484 dated Feb. 1, 2008.

* cited by examiner

METHOD AND APPARATUS FOR THE PRODUCTION OF CRYSTALLINE SILICON SUBSTRATES

This application is a continuation of application Ser. No. 12/576,614, filed Oct. 9, 2009 which is a divisional of application Ser. No. 11/861,375, now U.S. Pat. No. 7,608,146, which claims benefit under 35 U.S.C. 119(e) to provisional application No. 60/827,246, all of which are incorporated herein by reference in their entirety for all their useful purposes.

FIELD OF THE INVENTION

The present invention relates to a method and apparatus for producing thin silicon substrates suitable for manufacturing photovoltaic cells, and in one of its aspects relates to a method and apparatus for laterally pulling a long crystalline ribbon from its melt which is established from unseeded growth and which is accomplished under strongly variable radiation control of heat loss.

BACKGROUND OF THE INVENTION

Development of energy sources that are alternatives to fossil fuels has become more and more important over the years. One such alternate source is solar energy wherein photovoltaic cells or the like directly convert solar energy into useful electrical energy. Typically, a plurality of these photovoltaic cells are encased between a transparent sheet (e.g. glass, plastic, etc.) and a sheet of backing material to form a flat, rectangular-shaped module (sometimes also called "laminate" or "panel") which, in turn, is installed onto the roof of an existing structure (e.g. a house, building, or the like) to provide all or at least a portion of the electrical energy used by that structure.

A majority of photovoltaic cells are comprised of silicon-based, crystalline substrates. These substrates can be wafers cut from ingots of silicon or from ribbons of silicon where the ingots or ribbons are "grown" from batches of molten silicon. In the early development of ribbon crystal growth and solar energy, several apparatuses were developed to produce silicon bodies or substrates with good crystalline quality. Unfortunately, however, most of these ribbon growth apparatuses focused too intently (a) on producing perfect crystalline quality of the ribbon (e.g. the net shape of the substrates which were typically between 200 and 400 microns in thickness) or (b) on perfecting the combination of melt and growth necessary for a continuous growth operation. This resulted in only small crystalline areas being grown or, alternately, the entire operation was unstable due to dual melt isotherms in contact with the growth region.

As part of these efforts, significant focus was also placed on the application of cooling gas, primarily helium, to the growth region to effect the proper heat extraction required for the desired growth of the crystals. However, difficulties arose in maintaining the proper volume of cooling gas during a growth operation. That is, insufficient gas flow did not allow enough heat to be extracted during the growth of the crystalline substrate to enable sufficiently high growth rates to be readily economically competitive. On the other hand, merely increasing the flow of cooling gas to a rate sufficient to achieve the required extraction of heat resulted in the increased gas flow disrupting the melt surface of the substrate thereby preventing the formation of a desired flat sheet of crystal. Still another attempt to correct this problem involved decreasing the heater input power but, unfortunately, this resulted in poor thermal gradient control; i.e. the ability to maintain a stable crystal growth front without a proclivity to form dendrites.

More recently, other approaches have been proposed to overcome some of the above-described problems related to the growth of a silicon-based, crystalline substrate. For example, U.S. Pat. No. 4,329,195 describes a technique for growing a thin and wide substrate at relatively high rates by using a cooling gas (i.e. mixture of argon and hydrogen or helium) and a seed crystal to start the growth of the substrate. However, the supply of molten silicon is replenished by a silicon feed rod which, in turn, is positioned into same melt zone that produces the nearby crystalline sheet, thereby creating an undesirable dual melt isotherm dilemma which presents control problems. Another technique involves directly contacting the substrate with a heat sink to control the extraction of heat from the substrate during growth; see U.S. Pat. No. 3,681,033 and "Float Zone Silicon Sheet Growth", C. E. Bleil, Final Report-DOE Grant No. DE-FG45-93R551901, Sep. 23, 1993 to Dec. 31, 1996 which may cause unevenness in the surface of the substrate.

Further, many prior techniques for forming crystalline substrates rely on the formation of a meniscus to act as the sole support of the growth process; see U.S. Pat. No. 2,927,008. However, many of such free-standing meniscus shaping and related techniques use graphite or silicon carbide dies for ribbon definition and accordingly, have the difficulty of providing a stable and uniform ribbon thickness under varying conditions. Also, continuous and direct contact with one of these carbon sources contributes to melt contamination and limits the performance of an eventual solar cell. These types of techniques also rely on vertical pulling from the melt and since heat will be lost along the length of the growing ribbon perpendicular to the growth front, the total amount of heat which can be extracted is severely limited.

SUMMARY OF THE INVENTION

The present invention provides an apparatus and method for producing or forming a sheet or ribbon of silicon, preferably a sheet or ribbon of crystalline silicon, continuously from a melt pool of liquid silicon. The silicon is melted in a melt chamber and flowed into a growth tray where it forms a level melt pool of liquid silicon. Heat is passively extracted by allowing heat to flow from the melt pool up through a chimney which, in turn, is positioned downstream of the melt chamber. Heat is simultaneously applied to the growth tray to keep the silicon in its liquid phase while heat loss is occurring through the chimney. One end of a template is placed in contact with the melt pool at a point where heat loss has occurred so that the silicon starts to "freeze" (i.e. solidify) and adheres to the template. The template is pulled from the melt pool thereby producing a continuous ribbon of silicon, preferably crystalline silicon.

More specifically, the present invention provides an apparatus and method wherein silicon is melted within a crucible which, in turn, is positioned within a pressurized, water-cooled furnace. The crucible is supported on a growth plate which also supports a heat-extracting means (e.g. chimney) downstream of the crucible. The melted silicon flows through an outlet in the crucible and into a growth tray. Preferably, a dimple in the growth tray below the outlet and a mid-tray ridge aids in smoothing out the melted silicon as it fills the tray and forms a substantially uniform, level melt pool within the tray.

Adjustable means, e.g. throttle plates, are provided in the chimney by which the heat flow from the melt pool through the chimney can be regulated. Radiated heat (i.e. heat loss)

flows up through the chimney and is dissipated at the water-cooled walls of the furnace. A template is positioned into contact with the melt pool at a point where the controlled heat loss causes the silicon to start to solidify whereupon it adheres to the template. The template is extracted from the growth tray thereby pulling a sheet or ribbon of the now-solidifying silicon along with it. Although this invention is described with respect to using silicon as a feed material to form a ribbon of silicon, preferably crystalline silicon, which is suitable for manufacturing solar cells, it is to be understood that the apparatus and method of this invention can be used to convert other feed materials to ribbons of such feed materials. Such other feed materials can comprise, for example, other semiconductor materials. Preferably, the other feed materials have a melting temperature of at least about 1200° C., a high surface tension, and a liquid phase that is denser that the solid phase. When a feed material other than silicon is used, the material used to construct the growth tray and crucible will be selected so they are compatible with that particular liquid feed material.

BRIEF DESCRIPTION OF THE DRAWINGS

The actual construction operation, and apparent advantages of the present invention will be better understood by referring to the drawings, not necessarily to scale, in which like numerals identify like parts and in which.

While the invention will be described in connection with its preferred embodiments, it will be understood that this invention is not limited thereto. On the contrary, the invention is intended to cover all alternatives, modifications, and equivalents that may be included within the spirit and scope of the invention, as defined by the appended claims.

DETAILED DESCRIPTION OF THE INVENTION

Figure 1:
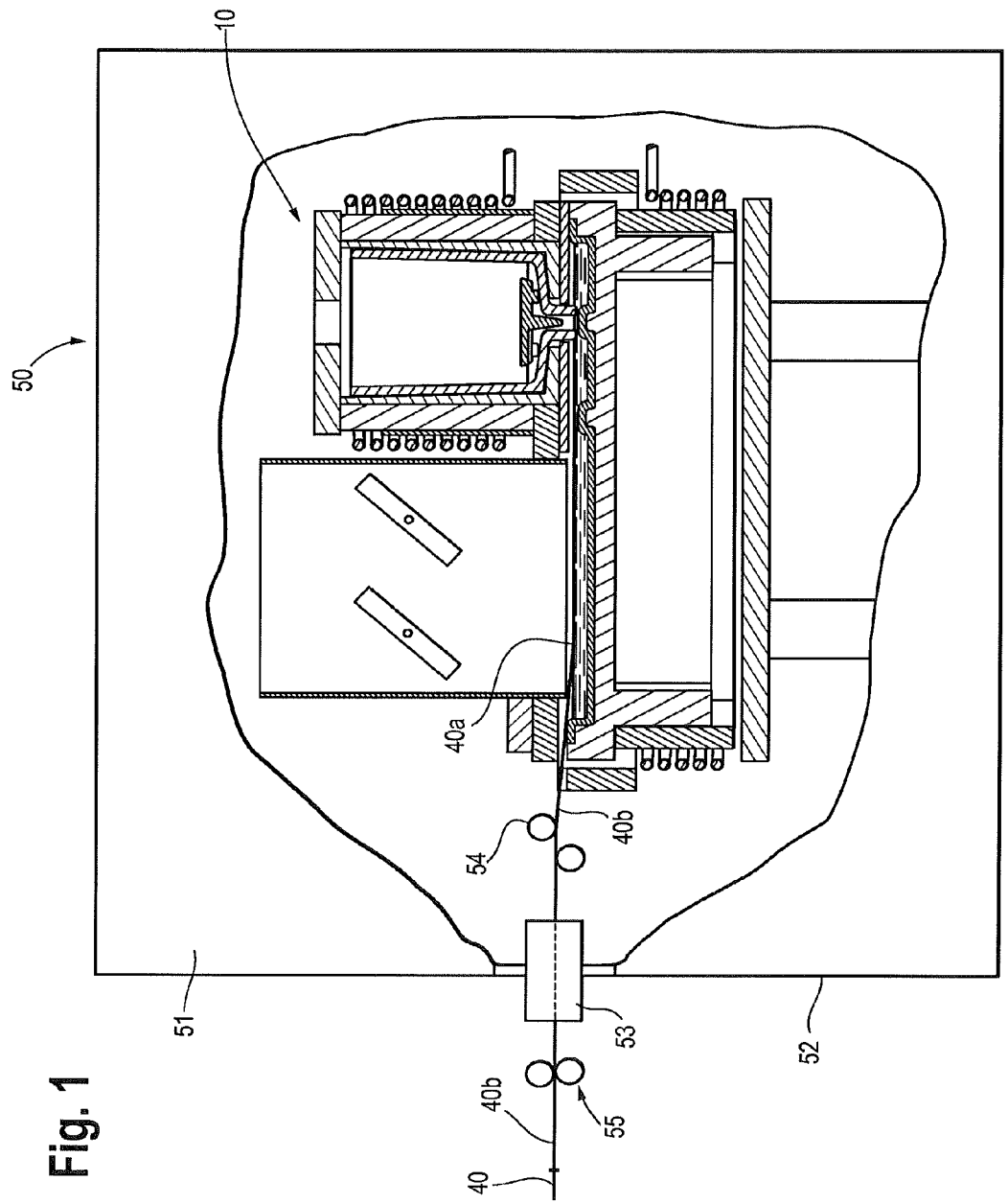
FIG. 1 is a simplified illustration of a furnace, partly broken away to show an embodiment of the apparatus of the present invention positioned therein for producing a crystalline substrate.

Referring now to the drawings, FIG. 1 illustrates a furnace 50 in accordance with the present invention. Furnace 50 is comprised of a vacuum/pressure vessel 51 having water-cooled walls 52 which allows control of the ambient conditions in the furnace. Positioned and supported within vessel 51 is apparatus which is used to produce a thin, continuous, preferably crystalline substrate or ribbon (used interchangeably throughout) in accordance with the method of the present invention.

Apparatus 10 is comprised of a melt chamber 11 which, in turn, is comprised of a pour crucible susceptor 12 which has pour crucible 13 positioned therein and has an insulation layer 14 therearound. The term "susceptor" as used throughout, refers to a structure that provides a stable body which (a) acts as a mechanical support at high temperature and (b) is electrically conductive to receive power from the induction heating coils. Positioned around insulation layer 14 is a heating means (e.g. electrical induction heating coil 15) for supplying the power necessary to melt silicon within pour crucible 13. A cover 16 closes the top of melt chamber 11 and has an opening 17 therethrough for feeding solid silicon (not shown) into pour crucible 13 as will be discussed more fully below.

Figure 2:
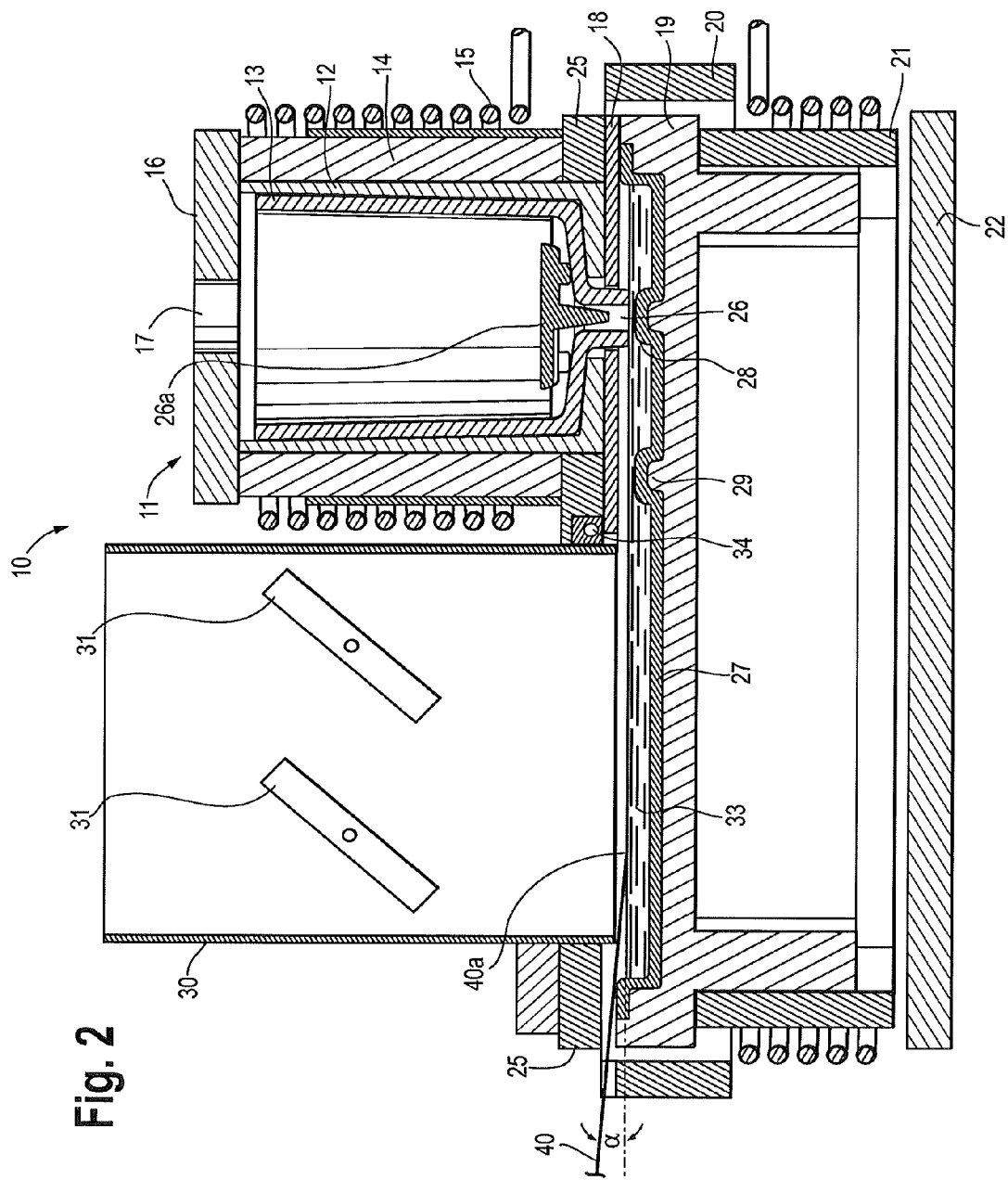
FIG. 2 is an enlarged view of the apparatus of FIG. 1.
Figure 3:
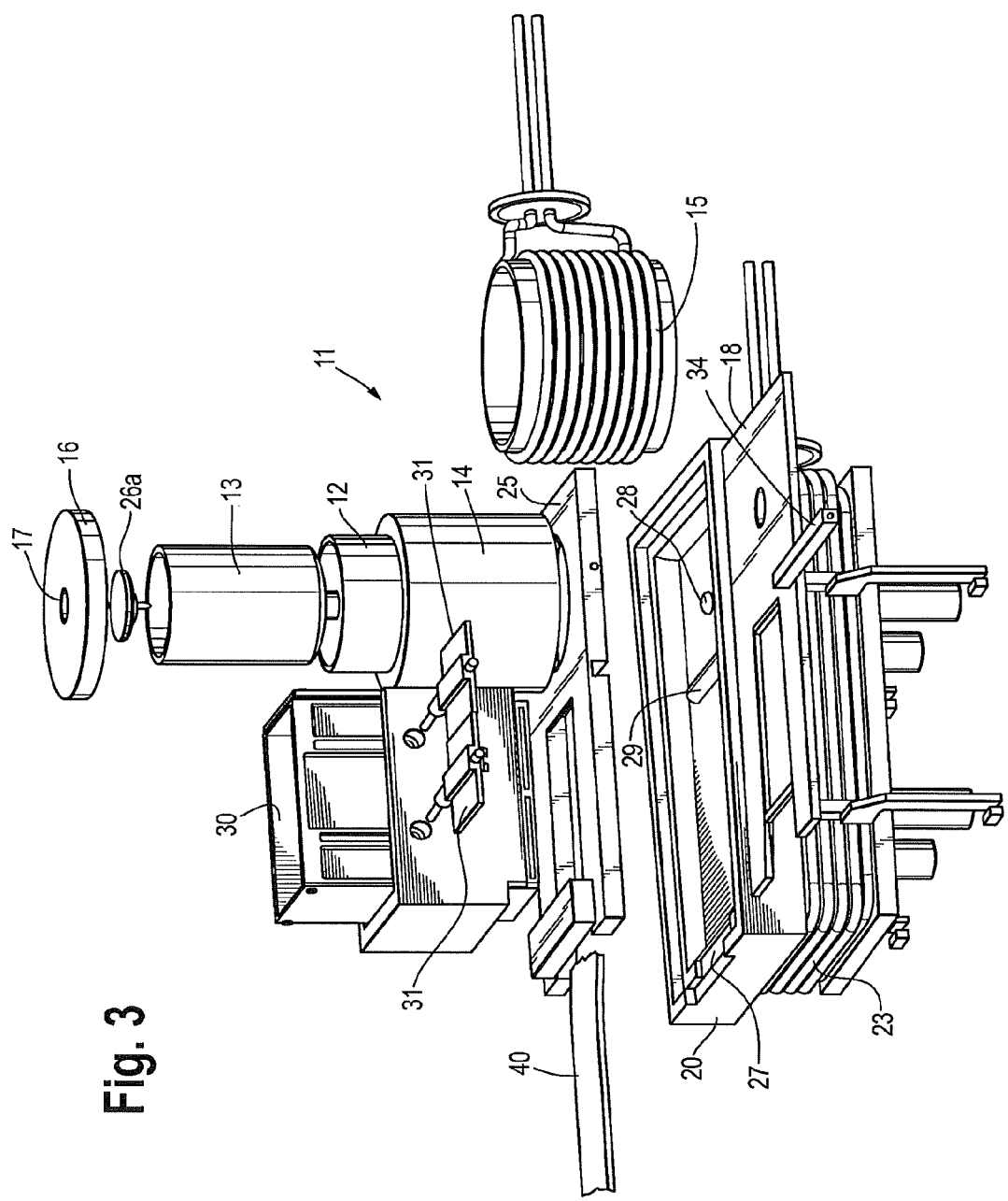
FIG. 3 is an exploded view of the apparatus of FIG. 2.

Pour crucible 13 is supported on growth plate 18 which, in turn, is supported on growth tray susceptor 19. As shown in FIG. 3, growth plate 18 is comprised of a graphite material that has been machined to provide support areas which are integral with areas of thermal isolation for selective heat extraction as will be explained below. An upper insulation layer 20, a lower insulation layer 21, and a bottom insulation layer 22 are positioned around growth tray susceptor 19 and growth tray heating means (e.g. electrical induction heating coil 23) encircles lower insulation layer 21 for a purpose described below. FIG. 3 does not show growth tray susceptor 19 separate from insulation 20, 21, and 22. Further, a forked-shaped layer 25 of insulation (see FIG. 3) is positioned above and along the length of growth plate 18 (see FIG. 2). Pour crucible 13 has an outlet 26 at its lower end which passes through openings in both layer 25 and in growth plate 18 and opens into growth tray 27 which, in turn, is supported on growth tray susceptor 19. A baffle 26a is positioned at the outlet 26 to effectively act as a filter to allow only molten silicon (i.e. melt pool 33-FIG. 2) to flow through the outlet while blocking any unmelted silicon or other solids.

Growth tray 27 has a dimple 28 directly below outlet 26 and a ridge 29 downstream from the outlet for a purpose described later. Growth plate 18 also supports heat-extracting means, e.g. chimney 30, which is spaced from but is in thermal communication with growth tray 27 as will be described below. The chimney 30 is positioned downstream of the outlet 26 and has an adjustable means (e.g. at least one throttle plate 31 (two shown) pivotably mounted therein) to control the heat flow through the chimney as will be further described below.

While the precise details of the present furnace are not critical and may vary substantially in different operations, the following discussion merely sets forth examples of typical dimensions and materials used and are not to be considered limiting in any way. As illustrated, pour crucible 13 may have a cylindrical shape (e.g. typical diameter of greater than 10 cm and a height of more than 15 cm to accommodate a quantity of feed material) and may be comprised of a material that is compatible with the material to be melted; i.e. to melt silicon, material is preferably comprised of silica. Growth plate 18 is a rectangular plate made of heat conductive material (e.g. carbon-graphite) and if as shown in the FIGS., might have typical dimensions of 30 cm long and 15 cm wide. The specific dimensions are free to be scaled to any width required for the desired ribbon sheet width and the length for the desired ribbon sheet pulling speed. Chimney 30 is preferably rectangular shaped to match the growth area of the growth plate 18 and is preferably primarily comprised of graphite, graphite insulation, and ceramics. Growth tray 27 is also preferably rectangular and, for example, can be 60 cm by 25 cm and approximately 30 mm deep, and is preferably comprised of at least 98% silica. With the construction of apparatus 10 having been described, the method of the present invention will now be set forth.

In operation, a desired amount of solid silicon (in chunks, small pieces, rods, or the like) is loaded through opening 17 into pour crucible 13 onto the top of baffle 26a and furnace 50 is closed and evacuated to remove oxygen that may contaminate or degrade the ribbon-growing process. Once a sufficient vacuum is established, the process chamber is heated to 300° C., then to 500° C., to assist in removing any moisture that may be adsorbed on the components of the furnace. The furnace is then backfilled with an inert gas (e.g. argon) to ambient pressure and the ribbon exit slot 53 is opened to enable a ribbon template 40 to be inserted into the furnace. Ribbon template 40 is preferably a thin sheet of a carbon-based material, such as a graphite coated carbon or graphite fabric, having approximately the same width as that of the desired ribbon which approximately matches the width of the lower end of chimney 30. A constant flow of argon is supplied through gas injector 34 to maintain positive pressure and outward flow from the head space between the melt pool 33 of molten silicon and the growth plate 18 and to prevent backstreaming of air into the furnace chamber through exit slot 53.

The temperatures of both the pour crucible 13 and the growth tray susceptor 19 are raised to and stabilized at approximately 1400° C. One end of ribbon template 40 is connected to any type of known extraction mechanism 54 and the other end is moved to a position near the melt pool 33 in growth tray 27, after which the temperature of growth tray susceptor 19 is raised to approximately 1420° C.

The power input to electrical induction heating coil 15 around the pour crucible susceptor 12 is increased by approximately 2000 watts, in this example, to begin melting the solid silicon in the pour crucible 13. At melt temperature (e.g. 1412° C.), approximately 1.1 grams of silicon should melt per second. The amount of power added is changed proportionally to the amount of silicon required for makeup. As melting occurs, the more dense molten or liquid silicon moves to the bottom of crucible 13 and out through outlet 26 into growth tray 27. Baffle 26a allows only the liquid silicon to pass through outlet 26 while blocking flow of any solids.

The liquid silicon passes through outlet 26 and directly on dimple 28 in growth tray 27. Dimple 28 reduces the splashdown depth of silicon and thereby limits ripple formation. Mid tray ridge 29 limits wave propagation into the growth area thereby providing a smoother surface to the liquid silicon melt pool 33 in tray 27. The molten silicon will spread out into a shallow pool of approximately 10 mm in depth. A shallow melt pool helps to suppress convection currents that cause localized hot spots and uneven thickness growth rate of the ribbon. By nature, molten silicon has a very high surface tension that may cause it to pull together and not flow freely into the desired thin layer of liquid. If this becomes a problem, it can be alleviated by flowing a gas, e.g. nitrogen, onto the melt pool 33 through gas port 34 to modify the surface properties of the melt pool.

It should be noted that, in a preferred embodiment of the invention, the gas supplied through gas port 34 is not to aid in cooling the melt pool but is to sweep or purge the surface of the melt pool and remove gaseous and small particle impurities that may exist in the space between the melt pool 33 and the growth plate 18. As will be further explained below, growth plate 18 provides for the removal of heat, preferably all of the heat, from the molten silicon required to reach the desired growth parameters. Since the ribbon to be formed is very thin, there will, preferably, only be a very small thermal gradient (e.g. approximately 0.3° C.) between its top and bottom surfaces at the point of separation with the melt pool 33.

When the melt pool 33 reaches a pre-determined depth (e.g. 10 mm), the power to coil 15 is reduced by 2000 watts and template 40 is moved into contact with melt pool 33 at contact point 40a to wet the edge of the template. Throttle plates 31 are opened to modulate the amount of radiation heat that can be extracted from the growth plate 18. The growth plate acts as a gas barrier and moderator between the melt and cold wall of the furnace with its modulation controlled by the open/closed angle of the throttle plates. This heat will radiate from the surface of the template 40 and/or growing ribbon 40b to the growth plate 18, through chimney 30, and on to the water-cooled walls 52 of the furnace 50 where it is dissipated. Preferably, the throttle plates are opened in sequence with the throttle plate nearest the contact point 40a being opened first to thereby allow the thin, silicon crystalline ribbon 40b to begin growth at the region 40a where the template 40 contacts the liquid silicon.

As known, the phase change between solid and liquid silicon is an isothermal process (both at 1412° C.), and much like water, significant amounts of energy (heat) can be removed or added without a change in temperature. Only part of the heat released on solidification is radiated to the growth plate 18 (useful work) while the balance is conducted away through the liquid in contact with the solid that has just formed. When the throttle plates 31 are opened, a fraction of the radiated power is added to coil 23 around growth susceptor 19 to assure a proper melt temperature gradient and to prevent formation of dendrites on the growing crystal. As used herein, "radiated power" is meant to be that power lost through radiation as opposed to conduction or convection.

It should be noted that in the preferred mode of operation, throttle plates 31 are the sole source of cooling control of the melt as the ribbon is formed. The throttle plates are actively controlled to begin growth and to control the thickness of the ribbon being formed. The opening of throttle plates allow modulation of heat flow from the melt pool 33 at its freezing point without significantly lowering the temperature of the liquid silicon present below the solid ribbon. As noted above, coil 23 provides an inductive source of heating to growth plate susceptor 19 which, in turn, heats and maintains the body of the melt pool 33 in a molten state as the ribbon is pulled from the melt pool.

Once the ribbon begins to form, the template 40 is extracted from the melt pool 33 and is advanced at a rate that is proportional to heat loss through the growth plate 18. The template 40 with the ribbon 40b attached thereto is extracted at a takeoff angle α that provides for the formation of the ribbon such as, for example and angle of from about 1° to about 15° (e.g. approximately 4°) (see FIG. 1) from horizontal to maintain a balance of forces against the buoyancy/weight of the liquid silicon, its surface tension, and triple-point meniscus between liquid melt pool 33, the solid ribbon, and the gas ambient. Since the present method of forming the silicon ribbon does not require using a single crystal seed as a template, it can avoid the many problems normally associated therewith. Also, induced stress in the ribbon can be reduced by allowing the ribbon to take a natural catenary shape coming off the melt pool 33. The cooling profile of the formed ribbon can be adjusted independently of the growth rate through various insulation means around extraction guides 54, thus allowing custom tailoring of silicon electrical properties.

Since the ribbon exits the furnace 50 shortly after formation (e.g. about 3 minutes or less), a direct thickness measurement can be used to make minor adjustments (a) to the throttle plates 31 to modulate the amount of heat loss through chimney 30, (b) to the pull speed to alter residence time, and/or (c) to the amount of power to the heating coils to affect net heat loss. As the ribbon forms, the extraction guides 54 can be used to maintain a smooth and even take-off angle while the arm or other extraction mechanism 55 (e.g. opposed rollers, "hand over hand" pinch grips, or other continuous feed devices) external to the furnace can be adjusted to maintain rate and continuous ribbon growth. Once a section of continuous ribbon has progressed past the extraction mechanism, it can be scribed and removed from the ribbon being formed, sectioned to finished substrate size, or left as part of the continuous ribbon for further processing in downstream operations.

Further, as should be understood in the art, a solid silicon feed mechanism (not shown) can cooperate with opening 17 in cover 18 on pour crucible 13 to add pieces of silicon into the pour crucible as needed to keep the operation continuous. The silicon pieces are normally added during the downtime between melt additions so that the solid silicon is brought to pre-melt temperature before the next cycle begins. Adjustment of the resistivity of the formed ribbon can be altered by varying the properties (dopants) of the solid silicon addition. Because the residence time of the system is low, this adjustment can be accomplished relatively quickly to maintain the formed ribbon within desired resistivity range. Also, if needed for growth stability and ribbon template formation, a heterogeneous seed surface can be formed in situ by the adding a small amount of nitrogen in the argon ambient through gas port 34. This forms a very thin (<10 mm) skin of silicon nitride/silicon oxynitride on the surface of the melt pool 33 to template the crystalline silicon growth underneath.

The continuous process will be interrupted when the growth tray or pour crucible have reached the end of their useful life, or the silicon melt pool has concentrated impurities or dopants to the point that adequate quality ribbon can no longer be produced. At this point, the furnace can be cooled, the worn components and silicon replaced, and the method restarted.

U.S. Provisional Patent Application No. 60/827,246, filed on Sep. 28, 2006, is incorporated herein by reference in its entirety.

What is claimed is:

1. An apparatus for producing a continuous, ribbon comprising a feed material, said apparatus comprising:
    a melt chamber for melting said feed material, said melt chamber having an outlet;
    a growth tray positioned to receive melted feed material from said outlet in said melt chamber; and
    a heat-extracting means spaced from but in thermal communication with said melted feed material in said growth tray and positioned downstream of said outlet in said melt chamber, said heat-extracting means including an adjustable means adapted to regulate the amount of heat which will radiate from said melted feed material in said growth tray.

2. The apparatus of claim 1 including: a baffle positioned in said outlet of said melt chamber and adapted to allow only melted feed material to flow through said outlet and into said growth tray, retaining any solids within the melt chamber.

3. The apparatus of claim 2 wherein heat-extracting means comprises:
    a chimney positioned on said growth plate downstream from said outlet of said melt chamber, said chimney adapted to allow heat to radiate from said melted feed material in said growth tray upward through said chimney; and
    wherein said adjustable means comprises: at least one throttle plate pivotably mounted in said chimney and moveable to control the area of the heat passage through said chimney.

4. The apparatus of claim 3 including:
    a dimple in said growth tray positioned below said outlet in said melt chamber, said dimple adapted to reduce the splashdown depth of melted feed material and to limit ripple formation of the melted feed material as it flows through said outlet and into said growth tray.

5. The apparatus of claim 4 including:
    a ridge in said growth tray positioned downstream of said dimple and adapted to limit wave propagation in the melted feed material in said growth tray.

6. The apparatus of claim 1 including: a growth tray susceptor having said growth tray supported thereon; and an electrical heating means for supplying induction heat to said growth tray through said growth tray susceptor to maintain the melted feed material in a liquid phase during the growth of said continuous ribbon.

7. The apparatus of claim 6 wherein said melt chamber comprises: a pour crucible susceptor having said pour crucible and said baffle supported thereon; and an electrical heating means for supplying induction heat to said pour crucible through said pour crucible susceptor to maintain feed material slightly below its melting point and regulate heat input to control rate of melting on demand.

8. A method for producing a continuous ribbon of a feed material, said method comprising:
    melting said feed material in a melt chamber;
    flowing said melted feed material from said melt chamber into a growth tray and allowing it to form a level, shallow melt pool in said growth tray;
    allowing heat loss from said melt pool through the radiation of heat from said melt pool up through a chimney which is positioned downstream from said melt chamber;
    positioning a template in contact with said melt pool at a point where said melt pool has experienced said heat loss to thereby cause said template to become attached to said melted feed material at said point;
    pulling said template away from said melt pool to thereby produce said ribbon;
    supplying heat to said growth tray to keep said feed material in said melt pool in its liquid phase during production of said ribbon; and
    regulating said heat loss from said melt pool by adjusting the flow through said chimney;
    wherein said template is pulled away from said melt pool at an angle of about 1.degree, to about 15.degree, with respect to the surface of said melt pool.

9. The method of claim 8 wherein said heat loss is regulated by moving at least one throttle plate in said chimney to increase or decrease the heat flow area through said chimney.

10. The method of claim 9 wherein said chimney has a first and a second throttle plate, positioned side by side across the flow area in said chimney with said first throttle plate being closer to said contact point between said template and said melt pool than said second throttle plate, and wherein said method further comprises: opening said throttle plates in sequence with said first throttle plate being opened first to allow said ribbon to begin growth.

11. The method of claim 10 including: sweeping the surface of said melt pool with flowing gas to remove gaseous and small particle impurities that may exist above said melt pool.

12. The method of claim 11 wherein said gas is comprised of argon and nitrogen.

13. The method of claim 12 including: adjusting the composition of said gas to alter the surface properties of the melt.

14. The method of claim 10 wherein template is comprised of a sheet of a carbon-based material.

15. The apparatus of claim 1 wherein said feed material comprises a semiconductor material.

16. The apparatus of claim 1 wherein said feed material comprises silicon.

* * * * *